(12) United States Patent
Liu (10) Patent No.: US 8,907,659 B2
(45) Date of Patent: Dec. 9, 2014

(54) RETRACTABLE TEST PROBE

(75) Inventor: Shaw-Lin Liu, New Taipei (TW)

(73) Assignee: Chung Instrument Electronics Industrial Co., Ltd., New Taipei (TW)

( * ) Notice: Subject to any disclaimer, the term of this patent is extended or adjusted under 35 U.S.C. 154(b) by 375 days.

(21) Appl. No.: 13/476,746

(22) Filed: May 21, 2012

(65) Prior Publication Data
US 2013/0307527 A1 Nov. 21, 2013

(51) Int. Cl.
*G01R 1/06* (2006.01)
*B43K 21/02* (2006.01)
*B43K 21/10* (2006.01)
*A45D 40/06* (2006.01)
*G01D 21/00* (2006.01)

(52) U.S. Cl.
USPC ............. 324/149; 401/53; 401/55; 401/62; 401/64; 401/69; 73/866.5

(58) Field of Classification Search
CPC ................................... G01R 1/06788
USPC ............. 324/149; 73/864.16, 866.5, 864.13; 401/53, 55, 62, 64, 69, 78, 79; 422/501; 74/18.1
See application file for complete search history.

(56) References Cited

U.S. PATENT DOCUMENTS

| | | | | |
|---|---|---|---|---|
| 1,402,239 A * | 1/1921 | Mason, Jr. | ...................... | 401/57 |
| 1,388,693 A * | 8/1921 | Blake | .............................. | 401/78 |
| 1,534,629 A * | 4/1925 | Anshen | ......................... | 401/17 |
| 1,806,632 A * | 5/1931 | Lynn | ............................... | 401/62 |
| 1,827,311 A * | 10/1931 | Felipe | ............................ | 401/17 |
| 1,956,271 A * | 4/1934 | Chesler | ......................... | 401/64 |
| 1,967,484 A * | 7/1934 | Stenersen | ..................... | 401/62 |
| 1,995,757 A * | 3/1935 | Stehl | .............................. | 401/64 |
| 2,072,922 A * | 3/1937 | Norlin | ............................ | 401/57 |
| 5,906,590 A * | 5/1999 | Hunjan et al. | ............. | 604/95.01 |
| 7,503,305 B2 * | 3/2009 | Johnson | ..................... | 123/197.4 |
| 7,880,487 B2 * | 2/2011 | Petrick | ..................... | 324/754.07 |

* cited by examiner

*Primary Examiner* — Jermele M Hollington
*Assistant Examiner* — Christopher McAndrew
(74) *Attorney, Agent, or Firm* — Chun-Ming Shih; HDLS IPR Services (57) ABSTRACT

The retractable test probe includes a main sleeve, a needle and a rotation positioning mechanism. The needle is rooted in the main sleeve. The rotation positioning mechanism includes an eccentric incoaxially fastened to the needle and a flexible sleeve around the eccentric and in the main sleeve. When the needle is turned towards a specific direction, the eccentric will be firmly fastened in the main sleeve through the flexible sleeve, when the needle is turned reversely, the eccentric will be released from the flexible sleeve to be retractably movable.

6 Claims, 8 Drawing Sheets

RETRACTABLE TEST PROBE

BACKGROUND OF THE INVENTION

1. Technical Field

The invention relates to test probes, particularly to retractable test probes.

2. Related Art

A multimeter or a multitester, also known as a VOM (Volt-Ohm meter), is an electronic measuring instrument that combines several measurement functions in one unit. A typical multimeter may include features such as the ability to measure voltage, current and resistance. A multimeter can be a hand-held device useful for basic fault finding and field service work or a bench instrument which can measure to a very high degree of accuracy. They can be used to troubleshoot electrical problems in a wide array of industrial and household devices such as electronic equipment, motor controls, domestic appliances, power supplies, and wiring systems. In some circumstances, test probes of a multimeter must be introduced into narrow gaps to touch the objects to be measured. However, length of current probes is not long enough, so those probes still cannot reach the objects to be measured when they are introduced into gaps.

A typical probe includes a needle and a main sleeve. The needle is rooted in the main sleeve and has a test portion which is protrudent from the main sleeve. Thus the test portion can be used to touch an object to be measured.

However, if the gap which is introduced by the probe is too deep, then the needle cannot touch the object to be measured.

SUMMARY OF THE INVENTION

An object of the invention is to provide a retractable test probe, in which a needle can be retracted to adjust its length. Thus the probe of the invention can be applied in a more variety of circumstances.

To accomplish the above object, the retractable test probe of the invention includes a main sleeve, a needle and a rotation positioning mechanism. The needle is rooted in the main sleeve. The rotation positioning mechanism includes an eccentric incoaxially fastened to the needle and a flexible sleeve around the eccentric and in the main sleeve. When the needle is turned towards a specific direction, the eccentric will be firmly fastened in the main sleeve through the flexible sleeve, when the needle is turned reversely, the eccentric will be released from the flexible sleeve to be retractably movable.

DETAILED DESCRIPTION OF THE INVENTION

Figure 1:
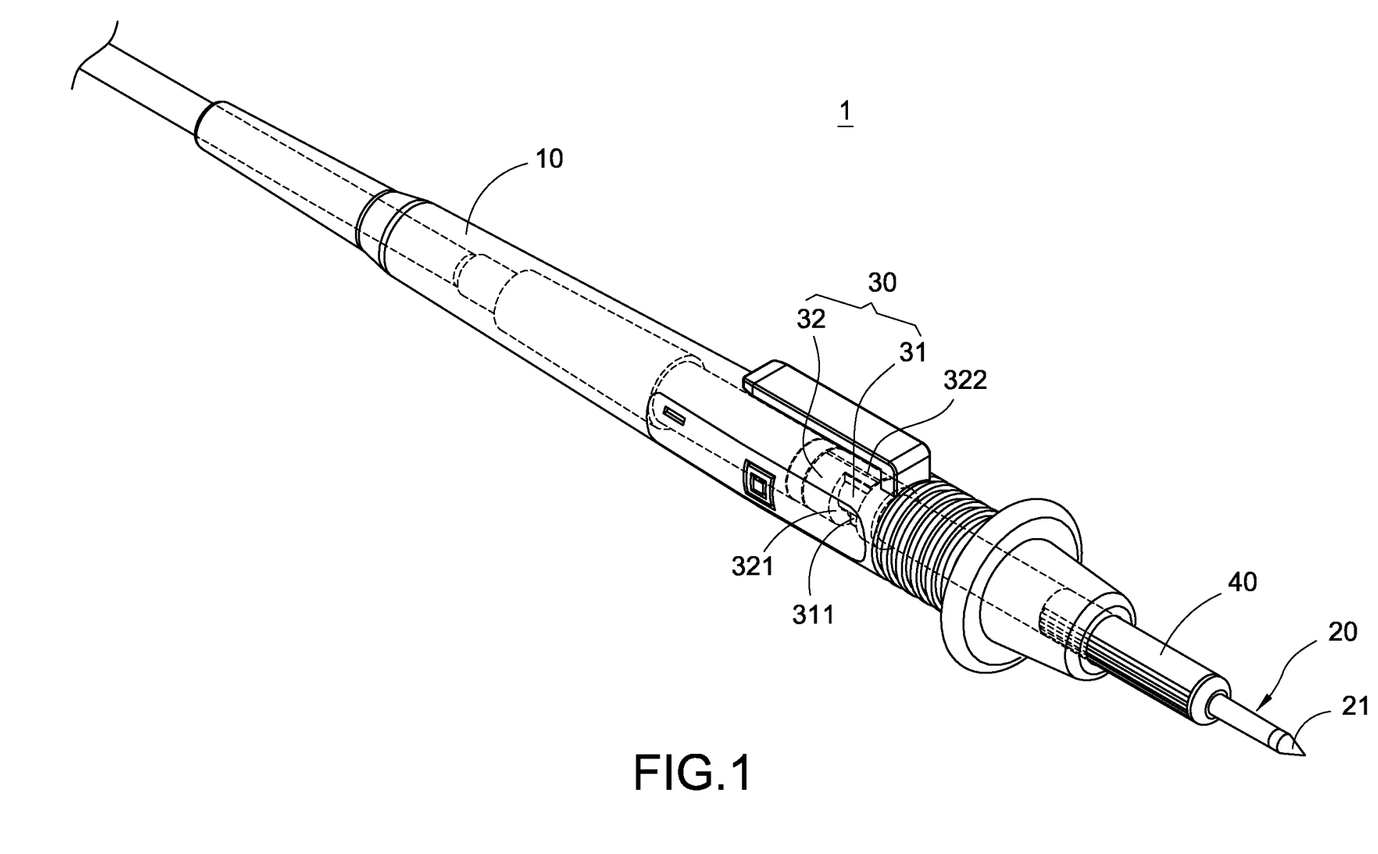
FIG. 1 is a perspective view of the invention.
Figure 2:
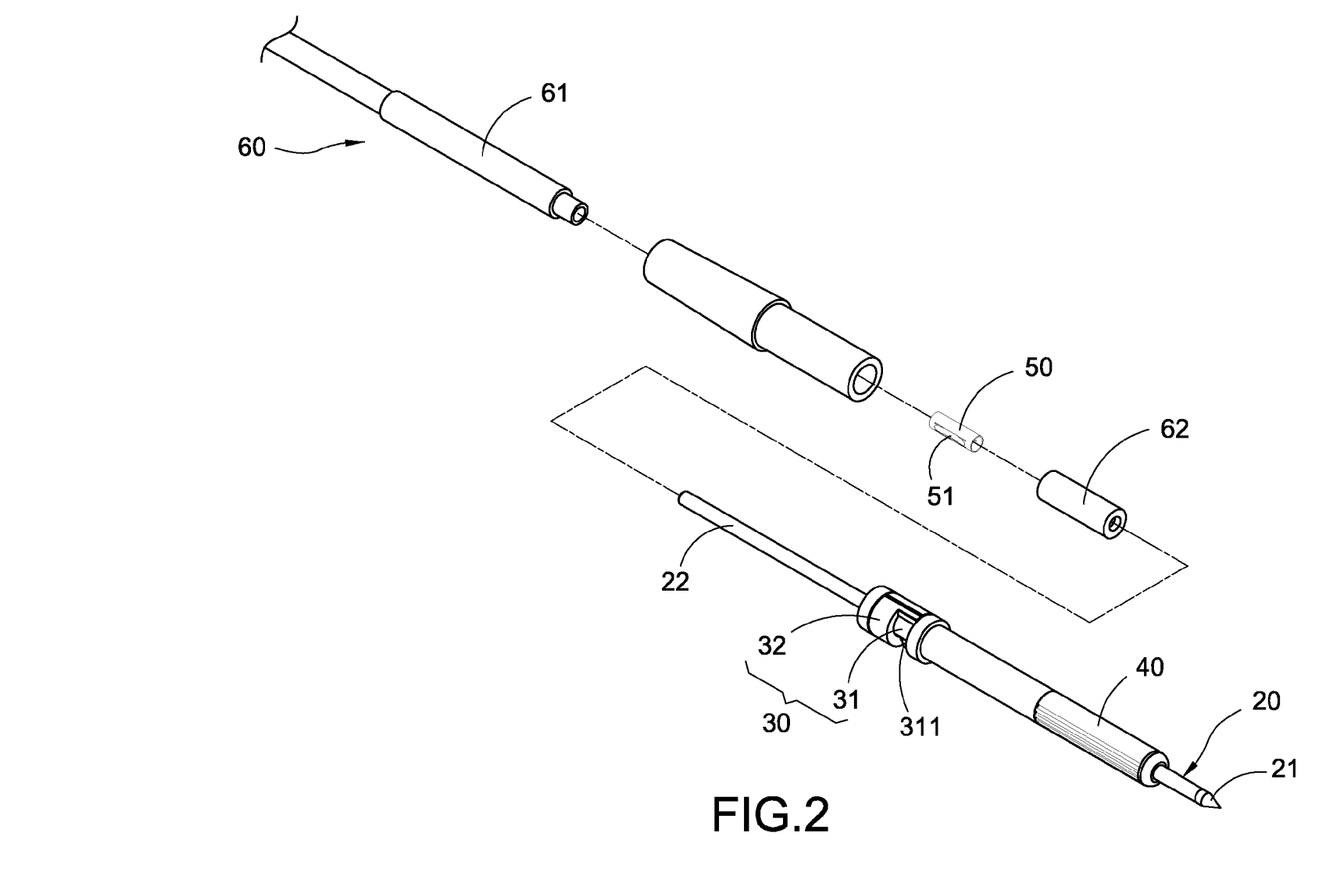
FIG. 2 is an exploded view of the invention.

Please refer to FIGS. 1 and 2. The test probe 1 of the invention includes a main sleeve 10, a needle 20 and a rotation positioning mechanism 30.

The needle 20 is rooted in the main sleeve 10. The needle 20 has a test portion 21 which is protrudent from the main sleeve 10 and a conduction portion 22 which is cloaked in the main sleeve 10.

The test probe 1 further includes an insulation sleeve 40 around the needle 20 and in the main sleeve 10. The insulation sleeve 40 is made of rubber.

Figure 3:
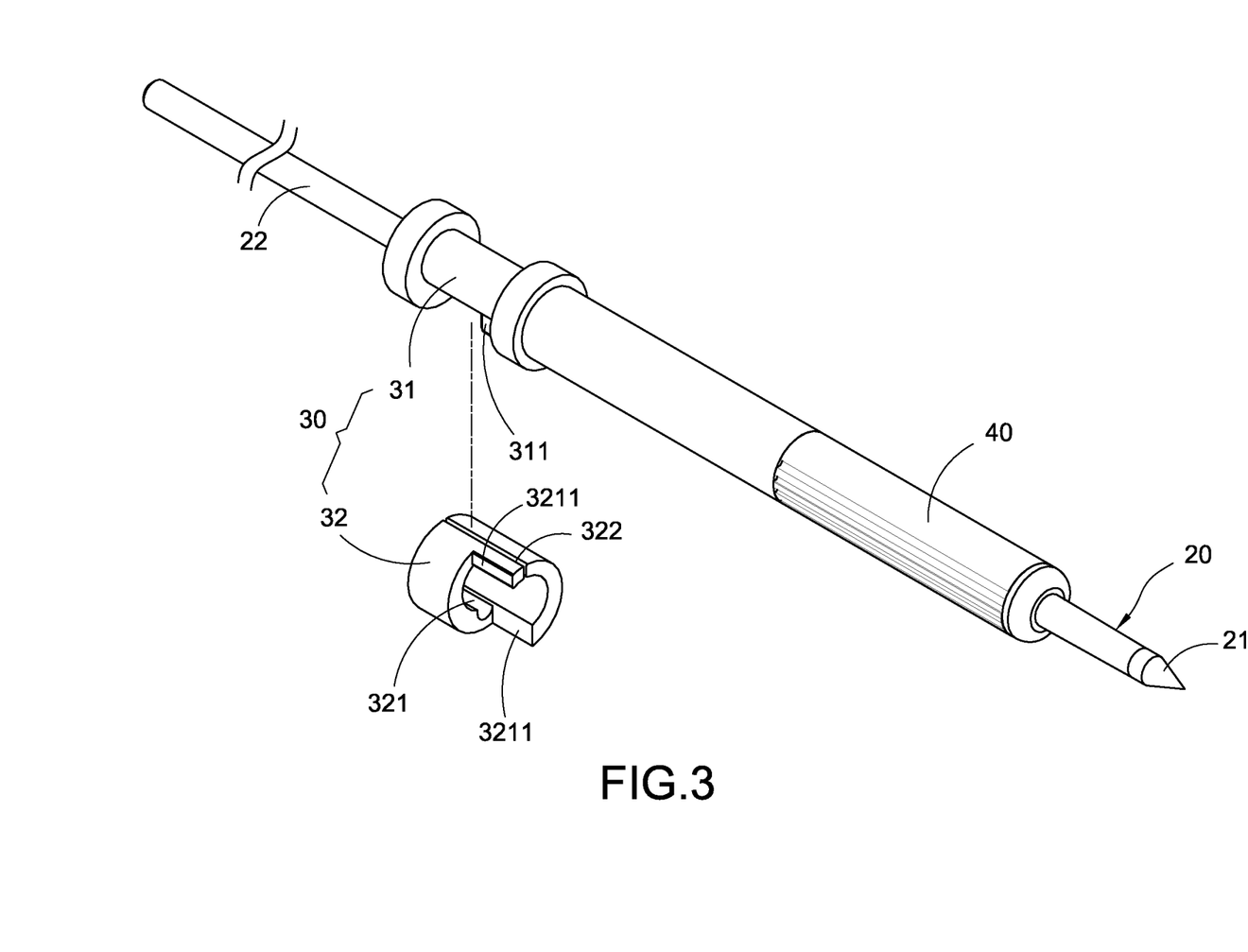
FIG. 3 is a partially enlarged view of the invention.
Figure 4:
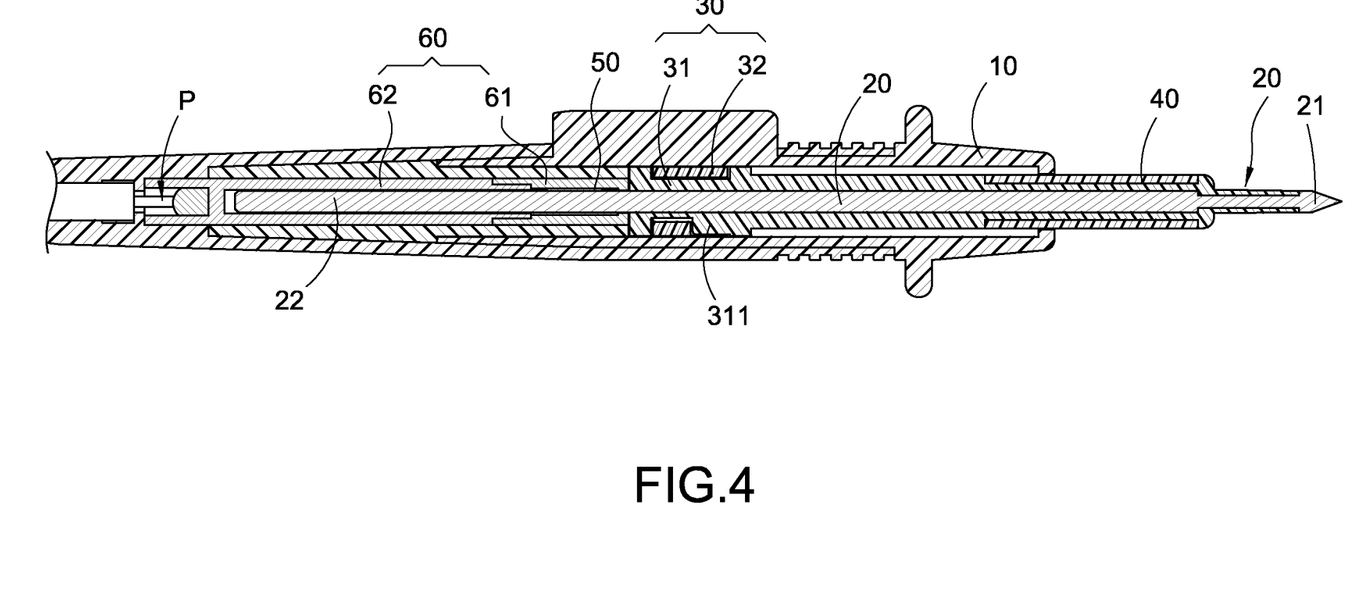
FIG. 4 is a longitudinal sectional view of the invention.

Please refer to FIGS. 3 and 4. The rotation positioning mechanism 30 includes an eccentric 31 and a flexible sleeve 32. The eccentric 31 is incoaxially fastened to the needle 20. That is, centers of the eccentric 31 and needle 20 are not coaxial. The eccentric 31 is formed with a positioning block 311. The flexible sleeve 32 is disposed around the eccentric and in the main sleeve. The flexible sleeve 32 is formed with a recess 321 for receiving the positioning block 311. Two ends of the recess 321 are separately formed with two stopping portions 3211 for limiting the positioning block 311. The flexible sleeve 32 is formed with a slot 322. Thickness of the flexible sleeve 32 is uneven and continuously varying. The flexible sleeve 32 may be made of rubber. The insulation sleeve 40 extends from an end of the eccentric 31.

The test probe 1 further includes a conductive sleeve 50 and a copper tube assembly 60. The conductive sleeve 50 is put around the conduction portion 22. A conductive elastic sheet 51 is formed on an inner side of the conductive sleeve 50. The conductive elastic sheet 50 is nipped between the conduction portion 22 and the conductive sleeve 50. The needle 20 is electrically connected to the conductive sleeve 50 through the conductive elastic sheet 51. The conductive sleeve 50 is made of metal.

The copper tube assembly 60 includes a first copper tube 61 and a second copper tube 62, which are longitudinally connected to each other. The conductive sleeve 50 is received in the second copper tube 62 and sandwiched between the first copper tube 61 and the second copper tube 62. The conductive sleeve 50 is electrically connected to the second copper tube 62 and the first copper tube 61 is electrically connected to a signal transmission module P.

Thereby, when the needle 20 is turned towards a specific direction, the eccentric 31 will be firmly fastened in the main sleeve 10 through the flexible sleeve 32. While when the needle 20 is turned reversely, the eccentric 31 will be released from the flexible sleeve 32 to be retractably movable. In other words, the test portion 21 of the needle 20 can be stretched or retracted.

Figure 5:
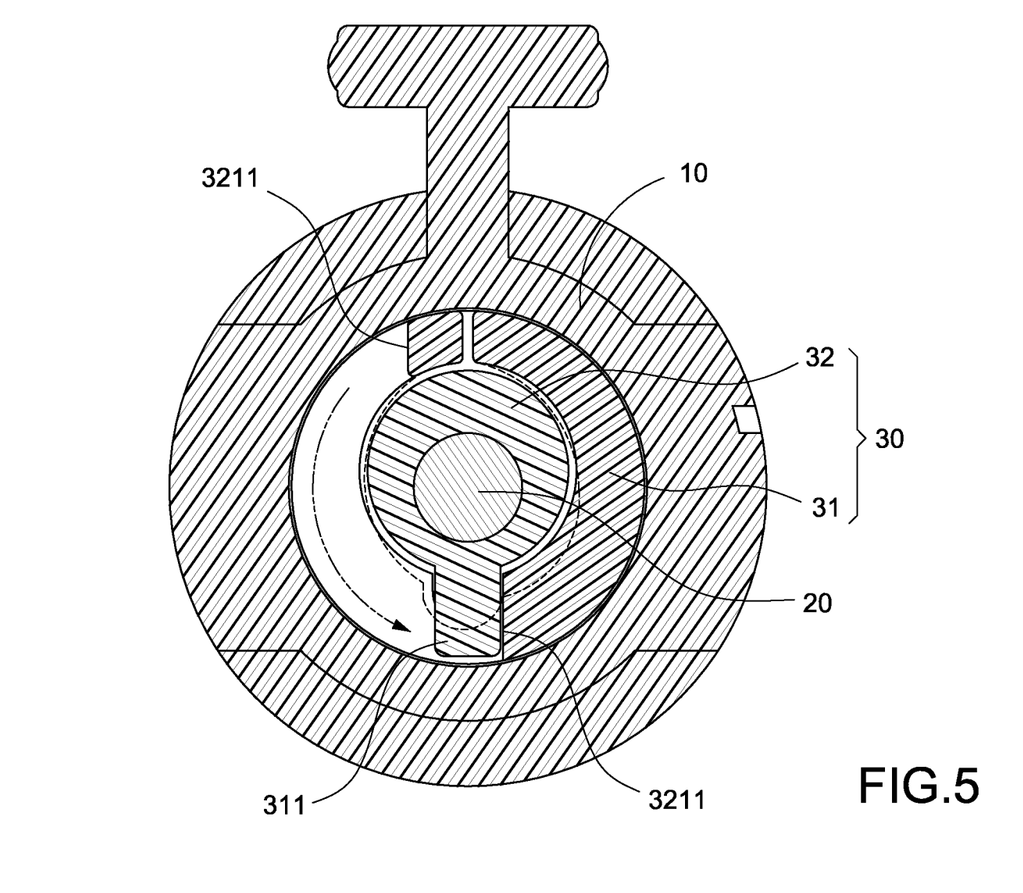
FIG. 5 is a cross-sectional view of the invention in a first status.
Figure 6:
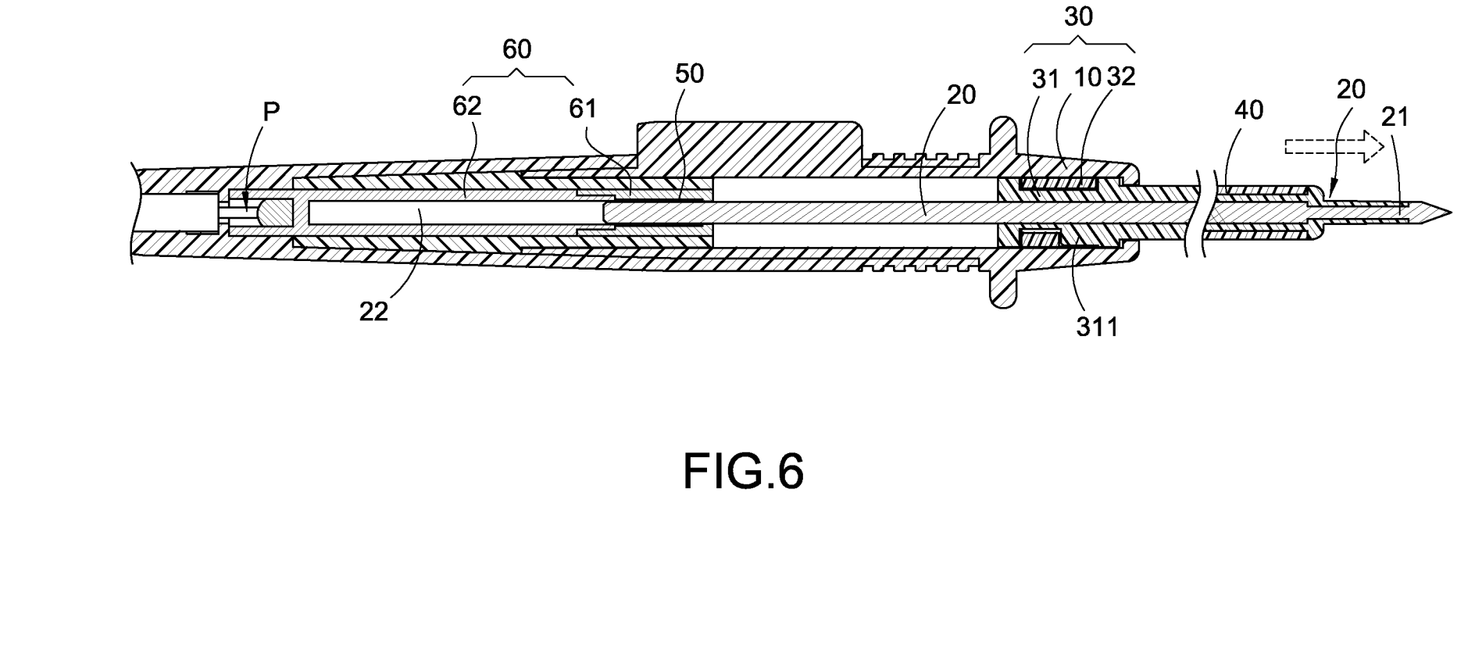
FIG. 6 is a longitudinal sectional view of the invention in the first status.

Please refer to FIGS. 5 and 6. When using the test probe 1 to touch an object, counterclockwise rotate the needle 20 to release the eccentric 31 from the flexible sleeve 32 to be movable and then stretch out the needle 20 to a desired length.

Figure 7:
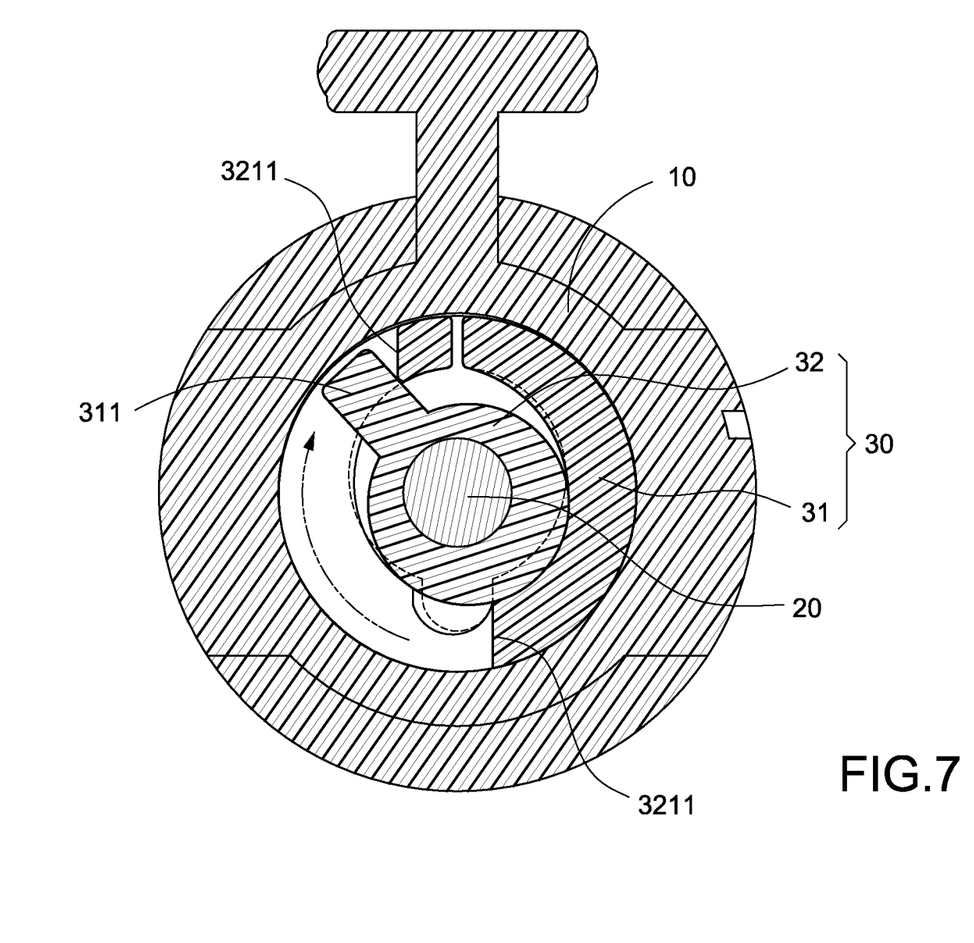
FIG. 7 is a cross-sectional view of the invention in a second status.
Figure 8:
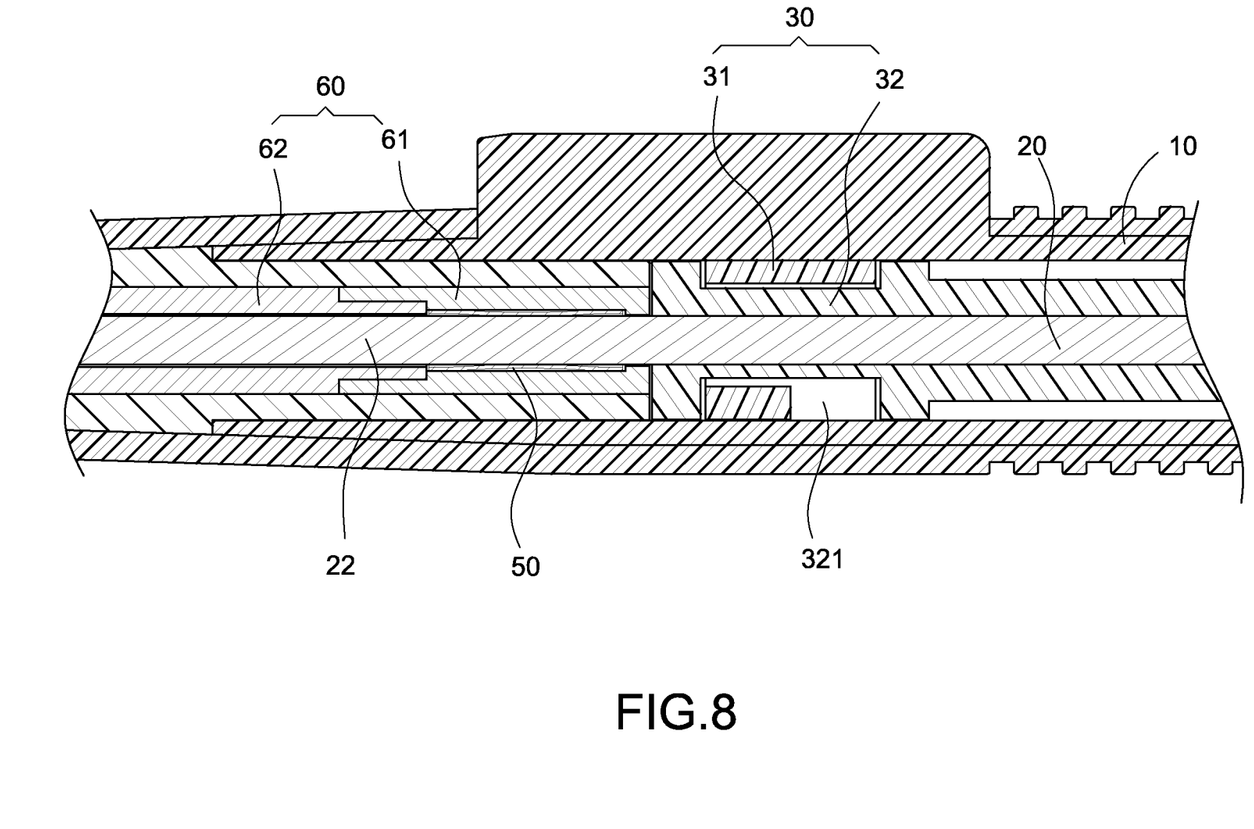
FIG. 8 is a longitudinal sectional view of the invention in the second status.

Please refer to FIGS. 7 and 8. When the needle 20 is rotated clockwise, the eccentric 31 is fastened in the main sleeve 10 through the flexible sleeve 32 to fix a position of the needle 20 relative to the main sleeve 10. Thus the needle 20 can prevent from retracting when it is touching an object. Additionally, the test portion 21 may be adjusted to a proper position to satisfy various circumstances.

While the forgoing is directed to a preferred embodiment of the present invention, other and further embodiments of the invention may be devised without departing from the basic scope thereof. As such, the appropriate scope of the invention is to be determined according to the claims.

What is claimed is:

1. A retractable test probe comprising:
a main sleeve;
a needle rooted in the main sleeve; and a conductive sleeve put around a conduction portion of the needle within the main sleeve to electrically connect with the needle;

a copper tube assembly including a first copper tube and a second copper tube, which are longitudinally connected to each other, the conductive sleeve being received in the second copper tube and sandwiched between the first copper tube and the second copper tube a rotation positioning mechanism, comprising an eccentric incoaxially fastened to the needle and a flexible sleeve around the eccentric and in the main sleeve;

wherein when the needle is turned towards a specific direction, the eccentric will be firmly fastened in the main sleeve through the flexible sleeve, when the needle is turned reversely, the eccentric will be released from the flexible sleeve to be retractably movable, wherein the conductive sleeve has a conductive elastic sheet nipped between the conduction portion and the conductive sleeve.

2. The test probe of claim 1, further comprising an insulation sleeve extending from an end of the eccentric, put around the needle and received in the main sleeve.

3. The test probe of claim 2, wherein the needle has a test portion protrudent from the insulation sleeve.

4. The test probe of claim 1, wherein the flexible sleeve is formed with a recess, two ends of the recess are separately formed with two stopping portions, the eccentric is formed with a positioning block received in the recess, and the stopping portions are used for limiting the positioning block.

5. The test probe of claim 1, wherein the flexible sleeve is formed with a slot.

6. The test probe of claim 1, wherein thickness of the flexible sleeve is uneven and continuously varying.

* * * * *